United States Patent
Won et al.

(10) Patent No.: US 10,998,013 B2
(45) Date of Patent: May 4, 2021

(54) MULTI-LEVEL SENSING CIRCUIT AND SEMICONDUCTOR MEMORY DEVICE INCLUDING THE SAME

(71) Applicant: SK hynix Inc., Icheon-si (KR)

(72) Inventors: Hyung Sik Won, Cheongju-si (KR); Tae Hun Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/841,110

(22) Filed: Apr. 6, 2020

(65) Prior Publication Data

US 2020/0234741 A1    Jul. 23, 2020

Related U.S. Application Data

(62) Division of application No. 16/044,201, filed on Jul. 24, 2018, now Pat. No. 10,650,867.

(30) Foreign Application Priority Data

Feb. 1, 2018  (KR) ........................ 10-2018-0012930

(51) Int. Cl.
| | | |
|---|---|---|
| *G11C 7/06* | (2006.01) | |
| *G11C 7/12* | (2006.01) | |
| *G11C 11/4099* | (2006.01) | |
| *G11C 11/4094* | (2006.01) | |
| *G11C 11/4091* | (2006.01) | |
| *G11C 7/08* | (2006.01) | |
| *G11C 11/56* | (2006.01) | |

(52) U.S. Cl.
CPC ............. *G11C 7/062* (2013.01); *G11C 7/065* (2013.01); *G11C 7/08* (2013.01); *G11C 7/12* (2013.01); *G11C 11/4091* (2013.01); *G11C 11/4094* (2013.01); *G11C 11/4099* (2013.01); *G11C 11/565* (2013.01)

(58) Field of Classification Search
CPC ........... G11C 7/062; G11C 7/08; G11C 7/065; G11C 11/565; G11C 7/12; G11C 11/4099; G11C 11/4094; G11C 11/4091; G11C 11/4085
See application file for complete search history.

(56) References Cited

U.S. PATENT DOCUMENTS 6,137,739 A    10/2000  Kim
7,355,913 B2    4/2008  Kang et al.
(Continued)

*Primary Examiner* — David Lam
(74) *Attorney, Agent, or Firm* — William Park & Associates Ltd.

(57) ABSTRACT

A multi-level sensing circuit for a multi-level memory device configured to "recognize" more than two different voltages. The multi-level voltage sensing circuit may include a pre-charge controller configured to pre-charge a pair of bit lines with a bit-line pre-charge voltage level in response to an equalizing signal during a sensing mode. The multi-level voltage sensing circuit may include a read controller configured to maintain a voltage of the pair of bit lines at the bit-line pre-charge voltage level in response to a read control signal during a sensing operation. The multi-level voltage sensing circuit may include a sense-amplifier configured to generate data of the pair of bit lines during the sensing mode. The multi-level voltage sensing circuit may include a voltage sensor configured to generate the equalizing signal by comparing a bit-line voltage with a reference voltage.

10 Claims, 8 Drawing Sheets

(56) References Cited

U.S. PATENT DOCUMENTS

| | | | |
|---|---|---|---|
| 7,876,635 B2 | 1/2011 | Oh | |
| 9,478,277 B1 | 10/2016 | Liu | |
| 10,593,418 B2 * | 3/2020 | Tiwari | ................... G11C 29/32 |
| 2017/0047113 A1 | 2/2017 | Kim et al. | |

* cited by examiner

MULTI-LEVEL SENSING CIRCUIT AND SEMICONDUCTOR MEMORY DEVICE INCLUDING THE SAME

CROSS REFERENCE TO RELATED APPLICATIONS

This application is a divisional application of U.S. patent application Ser. No. 16/044,201, filed on Jul. 24, 2018, and claims the priority filing date of Korean patent application No. 10-2018-0012930, which was filed on Feb. 1, 2018. The disclosure of that application is hereby incorporated in its entirety by reference.

BACKGROUND

1. Technical Field

Embodiments of the present disclosure may generally relate to a multi-level sensing circuit and a semiconductor device including the same, and more particularly to a technology for sensing multiple levels (multi-level).

2. Related Art

Dynamic Random Access Memory or "DRAM" is a well-known semiconductor memory device. It is also known as a "volatile" memory device.

A DRAM memory cell comprises a cell transistor and a cell capacitor. The cell transistor controls access to the cell capacitor. The DRAM cell capacitor stores electric charge. The state of that charge corresponds to binary-valued data. Stated another way, stored data in a prior art DRAM is classified as either high-level or low-level data depending on the amount of an electric charge stored in the DRAM cell capacitor. When a word line of a DRAM semiconductor device is enabled, charge-sharing occurs between a bit line and a bit line bar, i.e., the Boolean logic complement of the value on the bit line. A sense-amplifier then operates to determine the state of the charge on the DRAM capacitor.

In addition to a cell transistor and capacitor, a DRAM also includes a driver and/or a sense-amplifier, which transmit signals through a line or a bus. A DRAM memory cell also typically includes a sense-amplifier, which outputs data generated from a plurality of memory cells, to a data transfer line or data bus.

Semiconductor devices, including memory devices, continued to decrease in size. There is, however, a limit on how small a semiconductor, including semiconductor memory devices, can be made.

Prior art memory devices store data using only two different values or levels If data can be stored in a memory device that is capable of using more than two values or levels, more data can be stored per unit area than can be stored in a two-valued memory device.

SUMMARY

Circuitry disclosed herein senses multiple different voltage levels that represent different data values or different information and converts those different voltage levels to binary valued voltage that correspond to binary-valued data.

In one embodiment, a multi-voltage level sensing circuit includes a pre-charge controller, which pre-charges "bit lines" with a bit-line pre-charge voltage in response to an equalizing signal during a sensing mode. The multi-level sensing circuit also includes a read controller, which maintains a voltage of the bit lines at the bit-line pre-charge voltage level in response to a read control signal during a sensing operation. A sense-amplifier generates data from the bit lines during the sensing operation and, a voltage sensor generates an equalizing signal by comparing a bit-line voltage with a reference voltage.

In accordance with another embodiment of the present disclosure, a semiconductor device includes: a sense-amplifier configured to include a first pull-down power line and a second pull-down power line, and sense data of a pair of bit lines in response to drive voltages applied to first and second pull-down power lines during a sensing operation; a voltage controller configured to selectively supply bias voltages having different levels to the first and second pull-down power lines in response to drive signals activated at different times during the sensing operation; and a data converter configured to compare first sensed data and second sensed data received from the pair of bit lines with each other, and discriminate data in response to inversion or non-inversion of the compared data.

In accordance with another embodiment of the present disclosure, a multi-level sensing circuit includes: a first sense-amplifier configured to receive a drive voltage through a second pull-down power line and a fourth pull-down power line; a second sense-amplifier configured to receive a drive voltage through a first pull-down power line and a third pull-down power line; a first voltage controller configured to supply bias voltages having different levels to the first and second pull-down power lines in response to first and second drive signals during a sensing mode; and a second voltage controller configured to supply bias voltages having different levels to the third and fourth pull-down power lines in response to the first drive signal and a third drive signal during the sensing mode.

Those of ordinary skill in the art should understand that the foregoing Summary and the following Detailed Description are for purposes of illustration. The true scope of the subject matter claimed is set forth in the claims.

DETAILED DESCRIPTION

As used herein, relational terms such as first and second, top and bottom, and the like are used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but can include other elements not expressly listed or inherent to such process, method, article, or apparatus. An element proceeded by "comprises . . . a" does not, without more constraints, preclude the existence of additional identical elements in the process, method, article, or apparatus that comprises the element. And, like reference numbers are used to identify the same or similar structures in the different embodiments and views.

As used herein and for claim construction purposes, the term "multi-level" should be construed to mean more than two, i.e., three or more. In a conventional, binary-valued or digital logic circuit, a logic zero and a logic one are represented by two different voltages, the magnitudes and polarities of which are a design choice. A multi-level sensing circuit is thus a circuit that can sense, detect or identify three or more distinctly different voltages and produce an output signal representative of each. For some embodiments, a multi-level sensing circuit may be a multi-level voltage sensing circuit. For some embodiments, a multi-level memory device may include at least one cell array including at least one memory unit cell. For some embodiments, a semiconductor memory device may be a multi-level semiconductor memory device. For some embodiments, a memory device may include at least one cell array including at least one memory unit cell.

Figure 1:
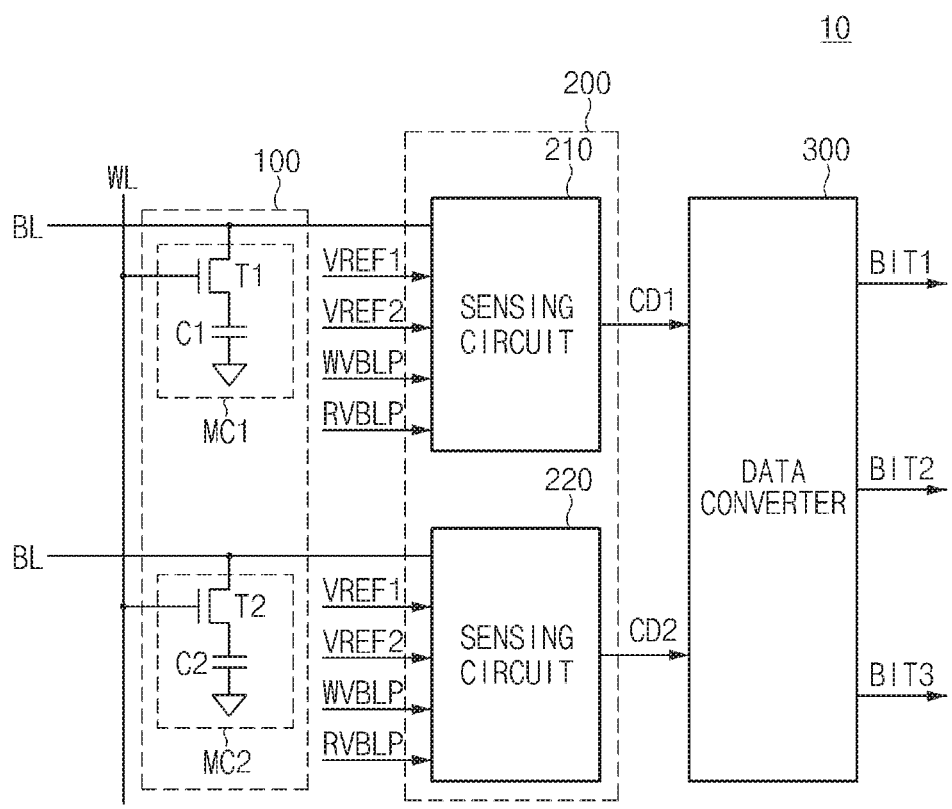
FIG. 1 is a schematic diagram of a first embodiment of a semiconductor memory device that includes a first embodiment of a multi-level sensing circuitry.
Figure 2:
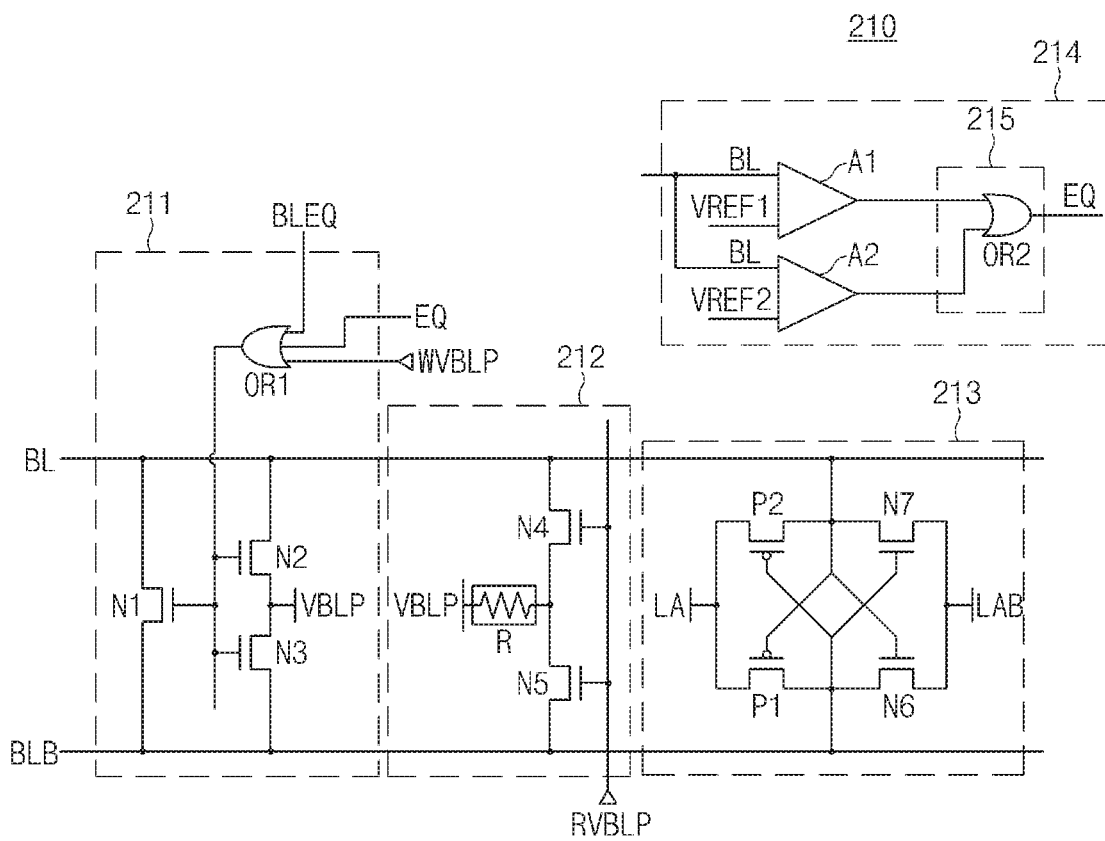
FIG. 2 is a schematic diagram of the first embodiment of a multi-level sensing circuit shown in FIG. 1.

FIG. 1 is a schematic diagram of a first embodiment of a semiconductor memory device 10. It comprises a cell array 100, a multi-level sensing circuit 200, and a data converter 300. As shown in the figure, the multi-level sensing circuit 200 actually comprises two separate multi-level sensing circuits, the details of which are shown in FIG. 2.

The cell array 100 comprises two or more memory unit cells MC1 and MC2. As shown in the figure, memory unit cell MC1 comprises a single switching element T1, embodied in FIG. 1 as a field-effect transistor (FET) and a single capacitor C1. The capacitor stores voltages as charges, the value or magnitude of which represents data. Different voltages or charges stored on the capacitor C1 can represent correspondingly different scalar information. By way of example, three different voltages on C1 can be representative of integers zero, one and two.

Those of ordinary skill in the art will recognized that the "drain" terminal of FET switching element T1 is coupled to a "bit line," BL. The capacitor C1, is coupled between the "source" terminal of FET switching element T1 and a ground or other reference potential. C1 can thus be charged or discharged using signals on the bit line, BL, and the word line, WL.

Still referring to FIG. 1, the memory unit cell MC2 is identical to the memory unit cell MC1 but of course comprises a separate FET switching element denominated as "T2" and a separate capacitor denominated as "C2."

A first multi-level sensing circuit 200 shown in FIG. 1 comprises two separate multi-level sensing circuits 210 and 220, which sense the charge that represents "data" stored in the cell array 100. The sensing circuit 210 is able to pre-charge the bit line BL in response to a write control signal WVBLP, which occurs during a write operation. During a read operation, the sensing circuit 210 reads or obtains "data" from the memory unit cell MC1 and outputs a sense signal CD1, responsive to a read control signal RVBLP and reference voltages VREF1 and VREF2. A second sensing circuit 220 is identical to the first sensing circuit 200.

The data converter 300 converts the multi-valued sensing signals CD1 and CD2 received from the multi-level sensing circuit 200 to binary-valued output data identified in FIG. 1 as BIT1, BIT2 and BIT3. Logic levels of the sensing signals CD1 and CD2 applied to the data converter 300 are shown in the following Table 1.

TABLE 1

| CD1 | CD2 |
|---|---|
| 0 | 0 |
| 0 | 1 |
| 1 | 0 |
| 1 | 1 |
| 0 | VBLP |
| VBLP | 0 |
| 1 | VBLP |
| VBLP | 1 |

Logic levels of the 3-bit data BIT1~BIT3 output from the data converter 300 may be established as shown in the following Table 2.

TABLE 2

| BIT1 | BIT2 | BIT3 |
|---|---|---|
| 0 | 0 | 0 |
| 0 | 0 | 1 |
| 0 | 1 | 0 |
| 0 | 1 | 1 |
| 1 | 0 | 0 |
| 1 | 0 | 1 |
| 1 | 1 | 0 |
| 1 | 1 | 1 |

The sensing signals CD1 and CD2 detected by the multi-level sensing circuit 200 can be more than two values, e.g., either data "0", data "1", or a bit-line pre-charge voltage (VBLP) level. The bit-line pre-charge voltage (VBLP) level can be set to ½×VCC (i.e., a half level of a power-supply voltage VCC). The data converter 300 decodes the sensing signals CD1 and CD2, and thus outputs 3, binary-digit, i.e., 3-bit data values denominated as BIT1, BIT2 and BIT3, which are of course either a logic 1 or logic 0.

FIG. 2 is a schematic diagram of the first embodiment of a multi-level sensing circuit shown in FIG. 1. Since the sensing circuits 210 and 220 shown in FIG. 1 are identical, a detailed description of only the first sensing circuit 210 is provided.

Referring now to FIG. 2, the sensing circuit 210 comprises a pre-charge controller 211, a read controller 212, a sense-amplifier 213, and a pre-charge voltage sensor 214.

Upon receiving a bit-line equalizing signal BLEQ, an equalizing signal EQ, and a write control signal WVBLP, the pre-charge controller 211 may pre-charge a pair of bit lines (BL, BLB) with a bit-line pre-charge voltage (VBLP) level.

The pre-charge controller 211 comprises three NMOS FET transistors (N1~N3) and an OR gate, OR1. The gate terminals of the NMOS transistors (N1~N3) receive an output signal of the OR gate OR1, which controls or determines when those transistors are on and off. A first transistor N1 is coupled between two separate bit lines, BL and BLB. The other, series-connected transistors, N2 and N3, are coupled between the bit lines BL and BLB and receive a pre-charge voltage (VBLP) level through their common connection node.

Those of ordinary skill in the art should recognize that when the output of OR gate OR1 goes "high" transistors N1-N3 turn on. The transistors N1-N3 thus turn on when any one or more of the bit-line equalizing signal BLEQ, the equalizing signal EQ, and the write control signal WVBLP, are high or active.

The read controller 212 comprises series-connected transistors N4 and N5 coupled across the BL and BLB lines. A read control signal, RVBLP, which is provided to the gate terminals of N4 and N5, controls when those transistors are turned on. When the read control signal RVBLP is active, as happens during a sensing operation, the read controller 212 allows the bit lines BL and BLB to be maintained at a common, pre-charge voltage level, VBLP that is provided to both N4 and N5. The read controller 212 can thus adjust current flowing in the bit lines (BL, BLB) responsive to the read control signal RVBLP during a sensing operation. The read control signal RVBLP is enabled by synchronizing it with activation of the sense-amplifier 213 during the sensing operation. In an embodiment, the read controller 212 may include a plurality of NMOS transistors N4 and N5 and a resistor R. In an embodiment, each of the NMOS transistors N4 and N5 may be implemented as a transistor having a longer channel length as compared to each transistor included in the sense-amplifier 213. In an embodiment, each of the NMOS transistors N4 and N5 may be implemented as a transistor having a longer channel length as compared to each transistor included in the pre-charge controller 211.

The NMOS transistors N4 and N5 may be coupled in series between the bit lines (BL, BLB), such that the NMOS transistors N4 and N5 may receive the read control signal RVBLP through a common gate terminal thereof. The resistor R may be coupled between a bit-line precharge voltage (VBLP) input terminal and a common node of the NMOS transistors N4 and N5.

Still referring to FIG. 2, the sense-amplifier 213 comprises NMOS transistors N6 and N7 and PMOS transistors P1 and P2. A common source terminal for the PMOS transistors P1 and P2 is coupled to a pull-up power line LA. A common source terminal for the NMOS transistors N6 and N7 is coupled to a pull-down power line LAB. A common gate terminal of the PMOS transistor P1 and the NMOS transistor N6 is coupled to the bit line BL. A common gate terminal of the PMOS transistor P2 and the NMOS transistor N7 is coupled to the bit line bar BLB.

The sense amplifier 213 is essentially a latch and is thus considered herein as providing a memory cell. During a sensing operation, the sense-amplifier 213 latches data on the bit lines BL, BLB). A semiconductor memory device, such as a dynamic random access memory (DRAM), may include the sense-amplifier 213.

After accessing each memory cell in the sense-amplifier 213, charge sharing is achieved between the memory cell and the pair of bit lines (BL, BLB) in the sense-amplifier 213. As a result, the sense-amplifier 213 essentially amplifies differences between the bit lines BL and BLB.

A pre-charge voltage sensor 214 comprises two voltage comparators, A1 and A2, the outputs of which are provided to a conventional OR gate, OR2. The pre-charge voltage sensor compares the voltage on bit line BL to each of two reference voltages VREF1 and VREF2. The output of the pre-charge voltage sensor, EQ, goes active when the voltage on bit line BL is greater than either or both of the reference voltages. The reference voltage VREF1 and the reference voltage VREF2 may be different voltages. Reference voltage VREF1 may be greater than reference voltage VREF2. For example, the reference voltage VREF1 may be set to a level greater than ½×VCC (i.e., a half level of the power-supply voltage VCC); reference voltage VREF2 may be set to a level less than ½×VCC.

The combination circuit 215 may output the equalizing signal EQ by combining output signals of the comparators A1 and A2. In this case, the combination circuit 215 may include an OR gate OR2. When at least one of the output signals of the comparators A1 and A2 is activated, the combination circuit 215 may activate and output the equalizing signal EQ.

The multi-level sensing circuit 200 shown in FIG. 2 will hereinafter be described with reference to the timing diagram of FIG. 3, which is a timing diagram illustrating operation of the multi-level sensing circuit 210 shown in FIG. 1.

Figure 3:
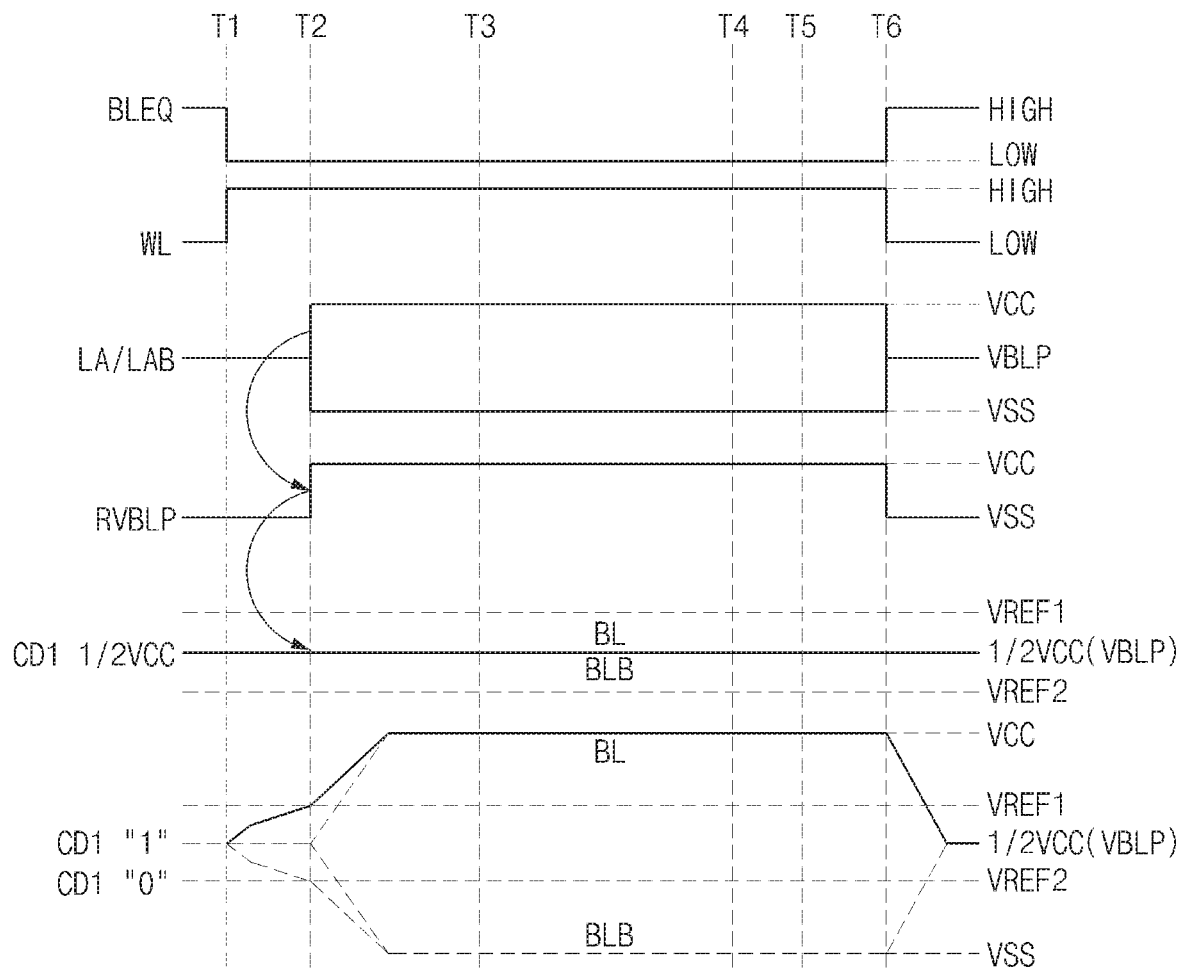
FIG. 3 is a timing diagram illustrating the operation of the multi-level sensing circuit shown in FIG. 2.

Referring now to both FIG. 2 and FIG. 3, when the equalizing signal BLEQ (See FIG. 2.) provided to OR gate OR1 is active during a pre-charge operation, bit lines (BL, BLB) are-pre-charged through N2 and N3 with the bit-line pre-charge voltage (VBLP). When the write control signal WVBLP (See FIG. 2.) is subsequently activated during a write operation, (See WL in FIG. 3.) the NMOS transistors N1~N3 of the pre-charge controller 211 are turned on again. Thereafter, data received on the bit lines (BL, BLB), embodied as voltage levels differing from the VBLP voltage level, are latched or stored in the sense amplifier 213 (See LA/LAB in FIG. 3.) and thus stored in the cell array 100 shown in FIG. 1. When the equalizing signal BLEQ (See FIG. 2.) is activated again during a pre-charge mode, the bit lines (BL, BLB) are "re-pre-charged" with the bit-line pre-charge voltage (VBLP) level. Previously-written data can thus be removed from BL and BLB.

Subsequently, when a row address strobe (RAS) signal acting as a main signal for operating the DRAM device is activated, so that an address is input to a row address buffer (not shown). In this case, a row decoding operation for selecting one of word lines WL contained in the cell array 100 is carried out by decoding the row address signals.

Data of cells coupled to a selected word line WL is applied to the pair of bit lines (BL, BLB). As a result, a sense-amplifier (also called a sense-amp) enable signal indicating an operation start time of the sense-amplifier 213 is enabled to drive a sense-amp driving circuit of a cell block selected by the row address signals. Stated another way, when the bit-line equalizing signal BLEQ is de-activated and the word line WL is activated during a read operation, the sense-amplifier 213 operates (i.e., time period T1). During operation of the sense-amplifier 213, a drive voltage is input to the pull-up power line LA and the pull-down power line LAB (i.e., time period T2). If the sense-amplifier 213 starts operation, voltages of the bit lines (BL, BLB) that have even a small potential difference between them are "transitioned" or changed or converted to instead have a high potential difference between them.

When the read control signal RVBLP transitions to a high level at T2, the sensing circuit 210 shown in FIG. 2, outputs the sensing signal CD1 shown in FIG. 1, by detecting data on the bit lines (BL, BLB). When a data value equal to a logic "1" is stored in the unit cell MC1, the sensing circuit 210 senses a level of the data "1" that is higher than the reference voltage VREF1 through the bit line BL. Thus, the sensing signal CD1 is output as the data value logic "1". When a data value equal to logic "0" is stored in the unit cell MC1, the sensing circuit 210 senses a voltage level of the logic "0" that is lower than the reference voltage VREF2 through the bit line bar BLB. Thus, the sensing signal CD1 may be output as the data "0".

When data having a level denoted by (½×VCC) is stored in the unit cell MC1, the pre-charge voltage sensor 214 activates the equalizing signal EQ by detecting a voltage level of the bit line BL. For example, when the voltage of the bit line BL is less than the reference voltage VREF1 and is higher than the reference voltage VREF2, the pre-charge voltage sensor 214 may activate the equalizing signal EQ.

When the equalizing signal EQ (See FIG. 2.) is activated, the bit lines (BL, BLB) are pre-charged with the bit-line pre-charge voltage (VBLP) level by the pre-charge controller 211 during a sensing operation. Between T2 and T6, during which time the read control signal RVBLP is active, NMOS transistors N4 and N5 of the read controller 212 are turned on. The VBLP voltage is applied to both bit lines (BL, BLB), which are thus maintained at the bit-line pre-charge voltage (VBLP) level during the sensing operation. The bit-line pre-charge voltage VBLP is slowly applied to the pair of bit lines (BL, BLB) through the resistor R, such that the bit lines (BL, BLB) remain unchanged at the (½×VCC) level. That is, the pre-charge controller 211 according to the embodiment may operate in the pre-charge mode, and may perform the pre-charge operation by the equalizing signal EQ in the sensing mode, such that the pair of bit lines (BL, BLB) can sense the bit-line pre-charge voltage (VBLP) level.

At T6, (See FIG. 3.) the bit-line equalizing signal BLEQ is re-activated. The read control signal RVBLP (See FIG. 2.) is also deactivated. The bit lines (BL, BLB) are thus pre-charged again to the VBLP voltage level or "re pre-charged." The multi-level sensing circuits 210 and 220 can thus read data "1" and data "0" but also read the (½×VCC) level (bit-line pre-charge voltage level), thereby sensing multiple voltage levels, each of which correspond to a different data value. The pre-charge controller 211, read controller 212, sense amplifier 213 and voltage sensor 214 that comprise the multi-level sensing circuits 210, 220 are thus considered to be circuits or structures, which are each "configured" to effectuate the sensing, as well as the storage of multiple different voltages, each level of which can be associated with a corresponding different data value.

Figure 4:
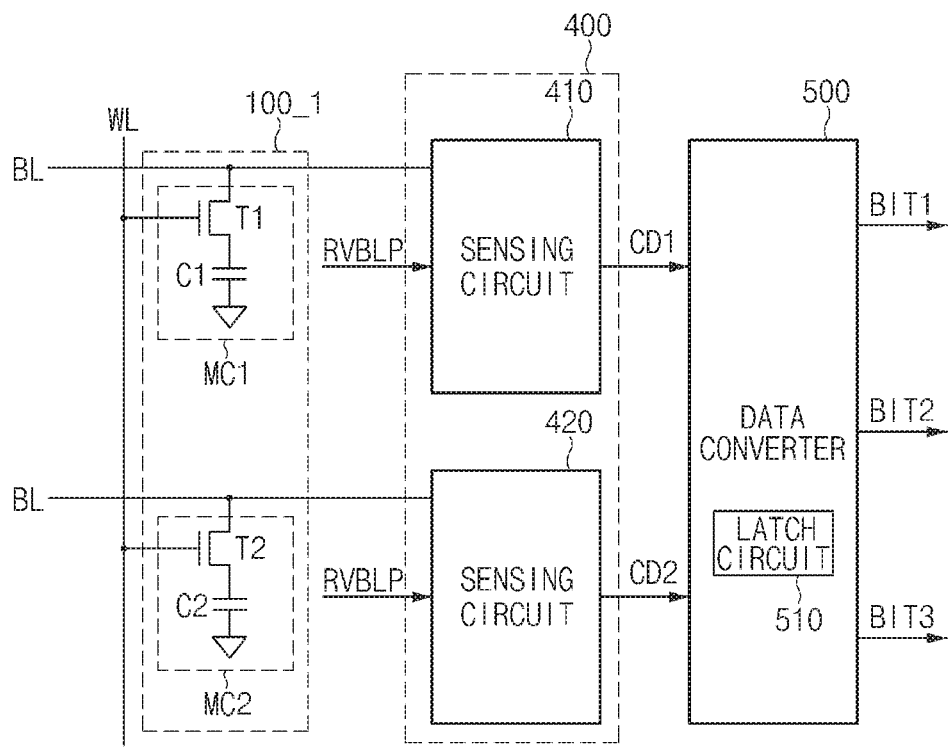
FIG. 4 is a schematic diagram of second embodiment of a semiconductor memory device that includes a second embodiment of a multi-level sensing circuitry

FIG. 4 is a schematic diagram of second embodiment of a semiconductor memory device 40, which includes a second embodiment of a multi-level sensing circuitry. The semiconductor device 40 comprises a cell array 100_1, a multi-level sensing circuit 400, and a data converter 500. The cell array 100_1 of FIG. 4 is identical in structure to the cell array 100 of FIG. 1. A description of the cell array 100_1 in FIG. 4 is therefore omitted in the interest of brevity.

The multi-level sensing circuit 400 in FIG. 4 comprises two sensing circuits 410 and 420, which are configured to sense data stored in the cell array 100_1. The sensing circuit 410 reads data of the unit cell MC1 in the cell array 100_1 in response to a read control signal RVBLP during a data read operation and outputs sensing signal CD1. Likewise, sensing circuit 420 reads data of the unit cell MC2 in response to the read control signal RVBLP during the data read operation and outputs the sensing signal CD2.

The multi-level sensing circuit 400 of FIG. 4 periodically senses voltage levels detected by the cell array 100_1 several times (e.g., twice) at predetermined time intervals. The multi-level sensing circuit 400 performs a mismatching of a voltage applied to a latch stage of a sense-amplifier, instead of comparing the voltage level detected by the cell array 100_1 with the reference voltage, such that the multi-level sensing circuit 400 discriminates or differentiates different voltage levels corresponding to data, generated during a data sense operation. The multi-level sensing circuit 400 is better understood by reference to FIG. 5.

The data converter 500 in FIG. 4, converts sensing signals CD1 and CD2 received from the multi-level sensing circuit 400 to output data signals identified in FIG. 4 as BIT1, BIT2 and BIT3. Operations of the data converter 500 for outputting the 3-bit data (BIT1~BIT3) is identical to the of the data converter 300 of FIG. 1, and as such a detailed description thereof will herein be omitted in the interest of brevity. In FIG. 4, however, the sensing signal CD1 can be input to the data converter 500 periodically, i.e., at predetermined time intervals. The data converter 500 in FIG. 4 can thus discriminate data by comparing a former sensing signal CD1 with a latter sensing signal CD2. The data converter 500 may thus include a latch circuit 510 to store the former sensing signal CD1 therein.

Figure 5:
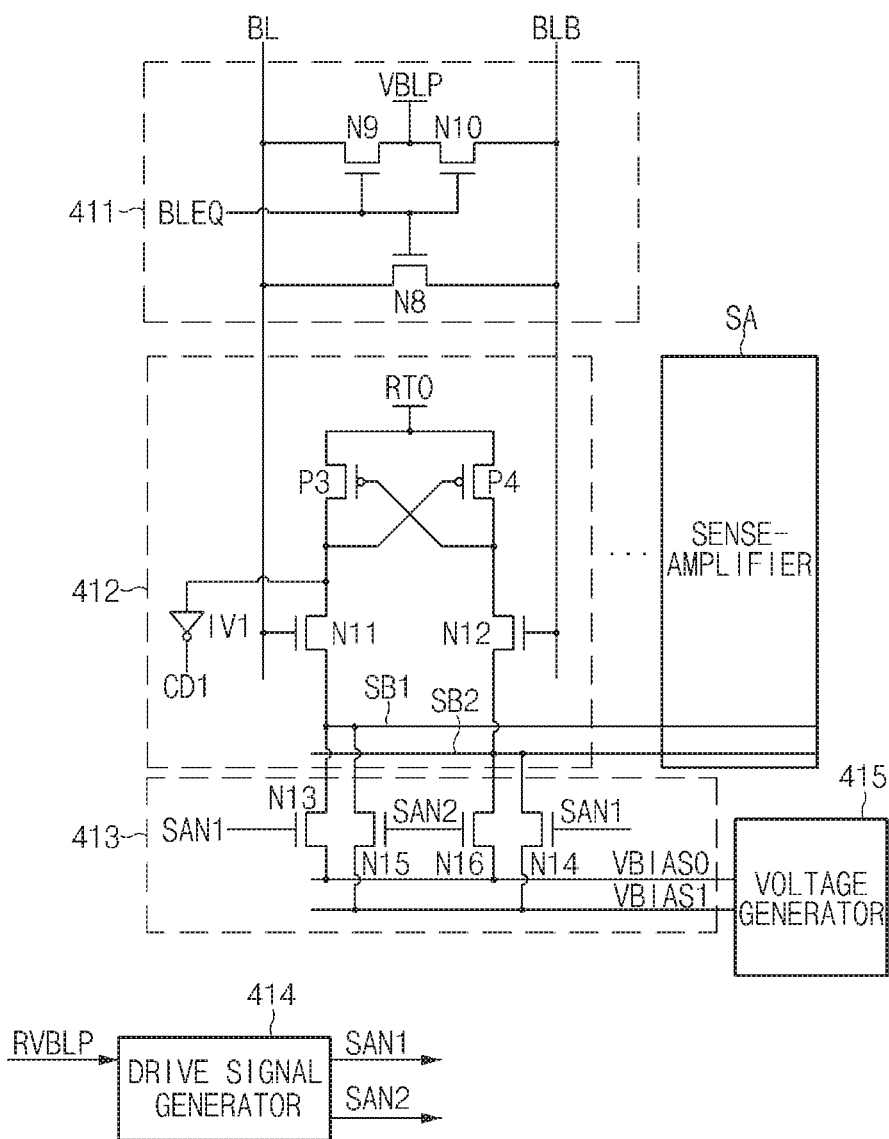
FIG. 5 is a schematic diagram of the second embodiment of a multi-level sensing circuit used in the circuit shown in FIG. 4.

FIG. 5 is a detailed circuit diagram illustrating the multi-level sensing circuit 400 shown in FIG. 4. Since the sensing circuit 410 and the other sensing circuit 420 for use in the multi-level sensing circuit 400 are identical in structure to each other, a detailed description of only the sensing circuit 410 shown in FIG. 5 will hereinafter be described for illustrative purpose and better understanding of the present disclosure.

The sensing circuit 410 comprises a pre-charge controller 411, a sense-amplifier 412, a voltage controller 413, a drive signal generator 414, and a voltage generator 415. Those of ordinary skill in the art should recognize that the pre-charge controller 411 pre-charges bit lines (BL, BLB) with a pre-charge voltage (VBLP) in response to the bit-line equalizing signal BLEQ during the pre-charge mode.

The precharge controller 411 may include a plurality of NMOS transistors N8~N10. The NMOS transistors (N8~N10) may receive the bit-line equalizing signal BLEQ through a common gate terminal thereof. The NMOS transistor N8 may be coupled between the bit lines BL and BLB. The NMOS transistors N9 and N10 may be coupled in series between the bit lines (BL, BLB), and may receive the precharge voltage (VBLP) level through a common connection node thereof.

Just as its name suggests, the sense-amplifier 412 senses data on the bit lines (BL, BLB) during a data sense operation. The sense-amplifier 412 comprises NMOS transistors N11 and N12 and PMOS transistors P3 and P4 coupled as shown in the figure.

The PMOS transistors P3 and P4 are coupled to a pull-up power line, RTO, through a common source terminal. The PMOS transistors P3 and P4 are cross-coupled to each other through their respective gate terminals.

NMOS transistor N11 is coupled between the PMOS transistor P3 and pull-down power line SB1. The gate terminal of the NMOS transistor N11 is coupled to the bit line BL.

NMOS transistor N12 is coupled between PMOS transistor P4 and pull-down power line SB2. The gate terminal of NMOS transistor N12 is coupled to bit line bar, BLB.

The output of inverter IV1 provides the sensing signal CD1, by inverting the signal at the node between PMOS transistor P3 and the NMOS transistor N11.

The voltage controller 413 comprises NMOS transistors N13~N16. It selectively provides either a bias voltage VBIAS0 or VBIAS1 to the pull-down power lines SB1 and SB2 in response to a drive signal, either SAN1 or SAN2, during a sense operation.

NMOS transistor N13 is coupled between the pull-down power line SB1 and the bias voltage VBIAS0. VBIAS0 is applied to SB1 when NMOS transistor N13 receives drive signal SAN1.

NMOS transistor N14 is coupled between pull-down power line SB2 and bias voltage VBIAS1. VBIAS1 is applied to SB2 when NMOS transistor N14 receives drive signal SAN1.

NMOS transistor N15 is coupled between the pull-down power line SB1 and the other bias voltage VBIAS1. VBIAS1 is thus applied to SB1 when NMOS transistor N15 receives drive signal SAN2.

Similarly, NMOS transistor N16 is coupled between pull-down power line SB2 and bias voltage VBIAS0. VBIAS0 is thus provided to SB2 when NMOS transistor N16 receives the drive signal SAN2.

The sense-amplifier 412 shares the pull-down voltages SB1 and SB2 with sense-amplifiers SA formed in a contiguous region.

The voltage controller 413 may be included in a sub-hole region. In this case, the sub-hole region may represent an intersection region of the sense-amplifier 412 and a word-line drive circuit. For example, the sub-hole region may include a sub-wordline drive circuit, a sense-amplifier (sense-amp) driver for generating a sense-amplifier drive signal, a bit-line equalizing driver for generating a bit-line equalizing signal BLEQ, and a bit-line isolation driver for generating a bit-line isolation signal, etc.

The drive signal generator 414 provides the bias voltages, SAN1 and SAN2 in response to a read control signal, RVBLP. The drive signal generator 414 periodically activate the bias voltages SAN1 and SAN2 at intervals having predetermined times during activation of the read control signal RVBLP.

The voltage generator 415 can generate bias voltages VBIAS0 and VBIAS1 having different voltage levels. For example, the bias voltage VBIAS0 may be greater than VBIAS1. The bias voltage VBIAS0 may also be less than ½×VCC. The bias voltage VBIAS1 may also have a value identical to or greater than the ground voltage (VSS) level or other reference potential.

Figure 6:
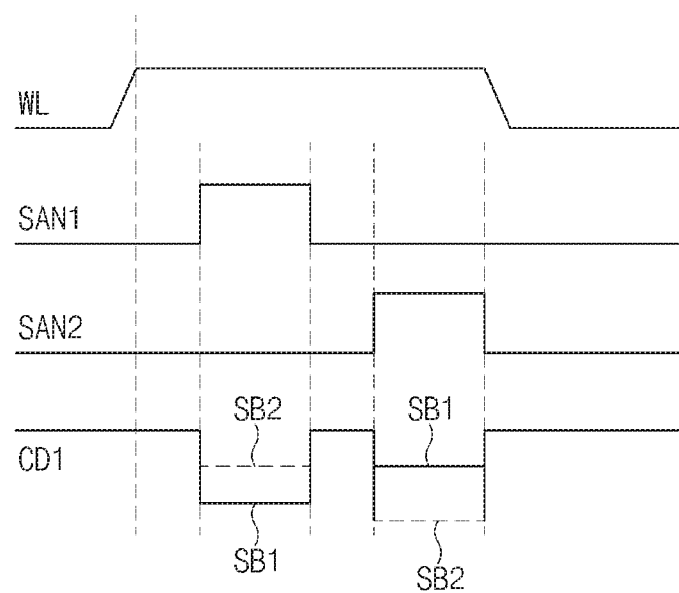
FIG. 6 is a timing diagram illustrating operations of the multi-level sensing circuit that is shown in FIG. 5.

FIG. 6 is a timing diagram illustrating operations of the multi-level sensing circuit 400 shown in FIG. 5. Referring now to both FIG. 5 and FIG. 6, when the equalizing signal BLEQ (See FIG. 5.) is activated during a pre-charge operation, the bit lines BL, BLB are pre-charged with the bit-line pre-charge voltage, VBLP. When the bit-line equalizing signal BLEQ is subsequently deactivated, and the word line WL (See FIG. 6.) is activated during a read operation, the sense-amplifier 412 starts operation, at which time, voltages are applied to the pull-up power line RTO of the sense amplifier 412 and to the pull-down lines SB1 and SB2.

When the read control signal RVBLP (See FIG. 5.) is activated to a high level, the drive signal generator 414 periodically activates the drive signals SAN1 and SAN2 for selectively supplying the bias voltages VBIAS0 and VBIAS1 to the pull-down power lines SB1 and SB2 of the sense-amplifier 412 at intervals of a predetermined time. The drive signal SAN1 may be activated earlier than the drive signal SAN2.

When the drive signal SAN1 is activated, the NMOS transistors N13 and N14 are turned on, which applies bias voltage VBIAS0 to the pull-down line SB1 and bias voltage VBIAS1 to the pull-down line SB2. The sense-amplifier can then sense data of the bit line BL, and output the sensing signal CD1.

Thereafter, when the drive signal SAN2 is activated, the NMOS transistors N15 and N16 are turned on. Bias voltage VBIAS1 is applied to pull-down power line SB1 and bias voltage VBIAS0 is applied to pull-down line SB2. The sense-amplifier 412 can then sense data of the bit line BL, and output the sensing signal CD1.

The embodiment shown in FIG. 5 can supply the same voltage (bit-line pre-charge voltage VBLP) to the pair of bit lines (BL, BLB) and may adjust the bias voltages VBIAS0 and VBIAS1 applied to the pull-down power lines SB1 and SB2 of the sense-amplifier 412, and thus discriminate data. That is, threshold voltages of the pull-down power lines SB1 and SB2 are adjusted in different ways such that a voltage applied to the latch stage is intentionally mismatched and a data level can be sensed.

For example, the voltage applied to the pull-down power line SB1 during each of the first and second sensing operations may be output as a voltage level denoted by a solid line of FIG. 6. In contrast, the voltage applied to the pull-down power line SB2 during each of the first and second sensing operations may be output as a voltage level denoted by a dotted line of FIG. 6.

The data converter 500 senses multiple levels (multi-level) by discriminating the sensing signal CD1 generated from the sensing circuit 410. That is, during a first sensing operation, the data converter 500 can store the sensing signal CD1 received from the sensing circuit 410 in the latch circuit 510. During the second sensing operation, the data converter 500 may compare the sensing signal CD1 received from the sensing circuit 410 with the signal stored in the latch circuit 510, thereby discriminating data.

For example, when each of a first sensing signal and a second sensing signal is output as data "1" (high level), the data converter 500 may determine data to be "1". When each of the first sensing signal and the second sensing signal is output as data "0" (low level), the data converter 500 may determine the data to be "0".

When the first sensing signal and the second sensing signal are different from each other as shown in the timing diagram of FIG. 6, the data converter 500 may determine the (½×VCC) level. Referring to the timing diagram of FIG. 6, the voltage applied to the pull-down power line SB1 during the first sensing operation and the voltage applied to the pull-down power line SB1 during the second sensing operation may have different voltage levels. Likewise, the voltage applied to the pull-down power line SB2 during the first sensing operation and the voltage applied to the pull-down power line SB2 during the second sensing operation may have different voltage levels.

That is, when data "1" is detected during the first sensing operation and data "0" is detected during the second sensing operation, the data converter 500 may determine the sensing data to be the (½×VCC) level. In contrast, when data "0" is detected during the first sensing operation and data "1" is detected during the second sensing operation, the data converter 500 may determine the sensing data to be the (½×VCC) level.

Figure 7:
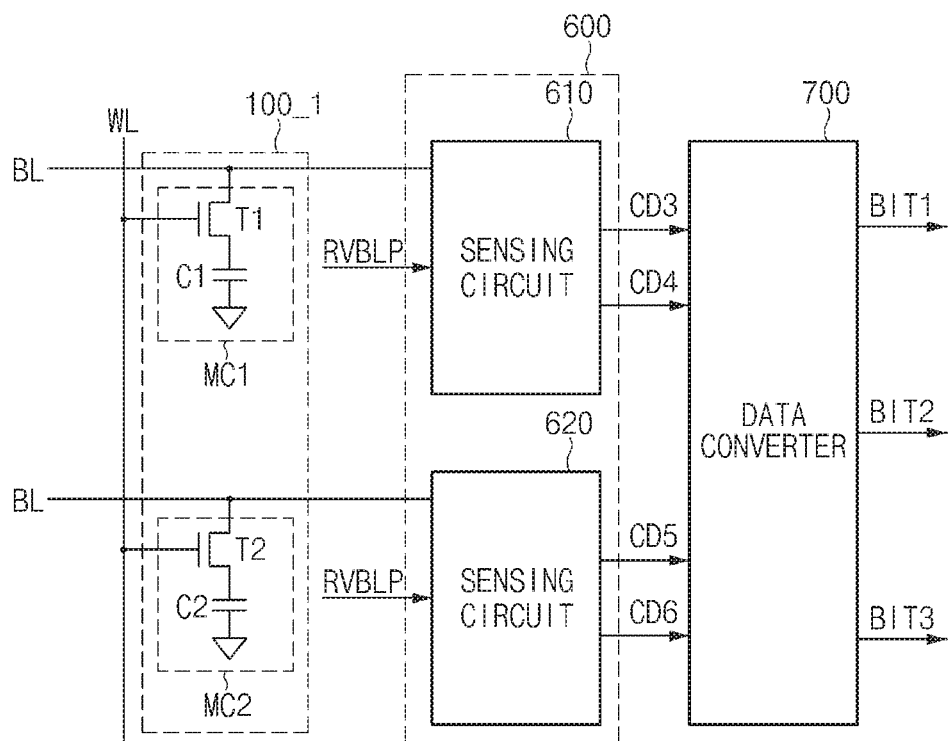
FIG. 7 is a schematic diagram of a third embodiment of a semiconductor memory device that includes a third embodiment of a multi-level sensing circuit; the present disclosure.

FIG. 7 is a circuit diagram illustrating a representation of an example of a semiconductor device 70 according to still another embodiment of the present disclosure. In FIG. 7, the semiconductor device includes the same cell array 100_1 described above. It also includes a multi-level sensing circuit 600 and a data converter 700.

The multi-level sensing circuit 600 comprises two identical sensing circuits 610 and 620, which sense data stored in the cell array 100_1. During a read operation, the sensing circuit 610 reads data of the unit cell MC1 in response to the read control signal RVBLP. It outputs sensing signals CD3 and CD4. Likewise, during a read operation, the sensing circuit 620 reads data of the unit cell MC2 in response to the read control signal RVBLP and outputs sensing signals CD5 and CD6.

The multi-level sensing circuit 600 of FIG. 7 discriminates different voltage levels on BL and BLB by mismatching a voltage applied to the latch stage of the sense-amplifier. It controls two sense-amplifiers to simultaneously sense voltages of latch stages. It controls the levels respectively detected by the bit lines BL and BLB to be different from each other by mismatching bias voltage levels applied to latch stages of two sense-amplifiers, thereby detecting multiple levels (multi-level). Operations of the multi-level sensing circuit 600 shown in FIG. 7 will hereinafter be described with reference to FIG. 8.

Figure 8:
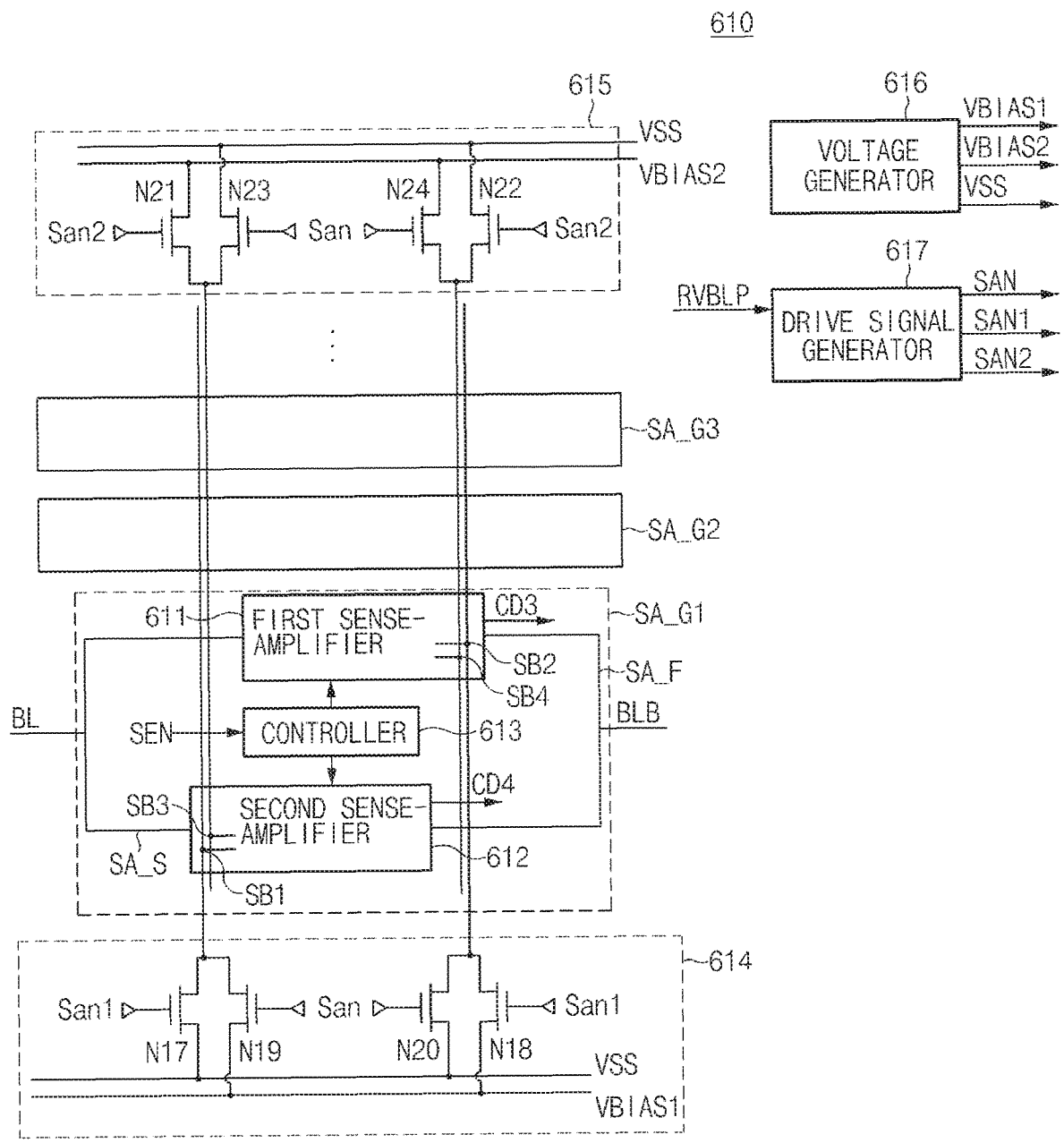
FIG. 8 is a schematic diagram of the third embodiment of a multi-level sensing circuit used in the circuit shown in FIG. 7.

The data converter 700 in FIG. 8 converts the signals CD3, CD4, CD5 and CD6 received from the multi-level sensing circuit 600 to binary output data signals identified in FIG. 7 as BIT1, BIT2 and BIT3. Operations of the data converter 700 for outputting data BIT1~BIT3 by decoding the sensing signals CD3~CD6 are identical to those of the data converter 300 of FIG. 1, and as such a detailed description thereof will herein be omitted for convenience of description.

However, the sensing circuit 610 according to the embodiment of FIG. 7 may simultaneously detect two sensing signals CD3 and CD4 received from two latch stages, such that the sensing circuit 610 may compare the two sensing signals CD3 and CD4 with each other, thereby discriminating a data level.

FIG. 8 is a detailed circuit diagram illustrating a representation of an example of the multi-level sensing circuit 600 shown in FIG. 7. Since the sensing circuit 610 and the other sensing circuit 620 for use in the multi-level sensing circuit 600 are identical in structure to each other, a detailed description of only the sensing circuit 610 shown in FIG. 8 will hereinafter be described for illustrative purpose and better understanding of the present disclosure.

Referring to FIG. 8, the sensing circuit 610 may include a plurality of sense-amplifier groups SA_G1~SA_G3, voltage controllers 614 and 615, a voltage generator 616, and a drive signal generator 617.

In this case, since the sense-amplifier groups SA_G1~SA_G3 are identical in structure to each other, a detailed description of only the sense-amplifier group SA_G1 shown in FIG. 8 will hereinafter be described for illustrative purpose and better understanding of the present disclosure. The sense-amplifier group SA_G1 may include a first sense-amplifier 611, a second sense-amplifier 612, and a controller 613. A detailed circuit of the first sense-amplifier 611 is identical in structure to that of the second sense-amplifier 612, and as such a detailed description thereof will herein be omitted for convenience of description.

In this case, the first sense-amplifier 611 may receive a drive voltage from the voltage controller 614 through the pull-down power line SB2, and may receive a drive voltage from the voltage controller 615 through the pull-down power line SB4. The first sense-amplifier 611 may output the sensing signal CD3 detected through the sensing node SA_F.

The second sense-amplifier 612 may receive a drive voltage from the voltage controller 614 through the pull-down power line SB1, and may receive a drive voltage from the voltage controller 615 through the pull-down power line SB3. The second sense-amplifier 612 may output the sensing signal CD4 detected through the sensing node SA_S.

The controller 613 may selectively control the first sense-amplifier 611 and the second sense-amplifier 612 in response to a sensing enable signal SEN. For example, the controller 613 may control the first sense-amplifier 611 and the second sense-amplifier 612 to simultaneously operate in the sensing section in which the sensing enable signal SEN is activated, such that the sensing signals CD3 and CD4 detected through the sensing nodes SA_F and SA_S can be simultaneously output. In contrast, the controller 613 may stop operation of the first sense-amplifier 611 and the second sense-amplifier 612 in a deactivation section of the sensing enable signal SEN, such that the sensing signals CD3 and CD4 are not output.

The voltage controller 614 may supply the bias voltage VBIAS1 or the ground voltage VSS to the pull-down power lines SB1 and SB2 during the sensing mode. The voltage controller 614 may include a plurality of NMOS transistors N17~N20.

The NMOS transistor N17 may be coupled between the pull-down power line SB1 and the ground voltage (VSS) input terminal, such that the NMOS transistor N17 may receive the drive signal SAN1 through a gate terminal thereof. The NMOS transistor N18 may be coupled between the pull-down power line SB2 and the bias voltage (VBIAS1) input terminal, such that the NMOS transistor N18 may receive the drive signal SAN1 through a gate terminal thereof. The NMOS transistor N19 may be coupled between the pull-down power line SB1 and the bias voltage (VBIAS1) input terminal, such that the NMOS transistor N19 may receive the drive signal SAN through a gate terminal thereof. The NMOS transistor N20 may be coupled between the pull-down power line SB2 and the ground voltage (VSS) input terminal, such that the NMOS transistor N20 may receive the drive signal SAN through a gate terminal thereof.

The voltage controller 615 may supply the bias voltage VBIAS2 or the ground voltage VSS to the pull-down power lines SB3 and SB4 during the sensing mode. The voltage controller 615 may include a plurality of NMOS transistors N21~N24.

In this case, the NMOS transistor N21 may be coupled between the pull-down power line SB3 and the bias voltage (VBIAS2) input terminal, such that the NMOS transistor N21 may receive the drive signal SAN2 through a gate terminal thereof. The NMOS transistor N22 may be coupled between the pull-down power line SB4 and the ground voltage (VSS) input terminal, such that the NMOS transistor N22 may receive the drive signal SAN2 through a gate terminal thereof. The NMOS transistor N23 may be coupled between the pull-down power line SB3 and the ground voltage (VSS) input terminal, such that the NMOS transistor N23 may receive the drive signal SAN through a gate terminal thereof. The NMOS transistor N24 may be coupled between the pull-down power line SB4 and the bias voltage (VBIAS2) input terminal, such that the NMOS transistor N24 may receive the drive signal SAN through a gate terminal thereof.

In accordance with the embodiment of the present disclosure, the respective sense-amplifiers of the plurality of sense-amplifier groups SA_G1~SA_G3 may share the pull-down power lines SB1~SB4 with one another.

The voltage generator 616 may generate bias voltages VBIAS1 and VBIAS2 having different voltage levels. For example, the bias voltage VBIAS1 may be higher in level than the bias voltage VBIAS2. The bias voltage VBIAS1 may be lower in level than the (½×VCC) level. The bias voltage VBIAS2 may be identical in level to or higher than the ground voltage (VSS) level.

The drive signal generator 617 may generate the drive signals SAN, SAN1, and SAN2 in response to the read control signal RVBLP. In other words, the drive signal generator 617 may activate the drive signals SAN, SAN1, and SAN2 during activation of the read control signal RVBLP.

Operations of the sensing circuit 610 shown in FIG. 8 will hereinafter be described with reference to the attached drawings.

When the word line WL is activated during the read mode, the sense-amplifier group SA_G1 may operate. During operation of the first sense-amplifier 611 and the second sense-amplifier 612, the drive voltage may be applied to the pull-down power lines SB1~SB4.

When the read control signal RVBLP is activated to a high level, the drive signal generator 617 may activate the drive signals SAN, SAN1, and SAN2 for selectively supplying the bias voltages VBIAS1 and VBIAS2 or the ground voltage VSS of the pull-down power lines SB1~SB4 of the first sense-amplifier 611 and the second sense-amplifier 612. In this case, the drive signals SAN, SAN1, and SAN2 may be simultaneously activated.

When the drive signal SAN is activated, the NMOS transistors N19, N20, N23, and N24 are turned on. Accordingly, the bias voltage VBIAS1 may be applied to the pull-down power line SB1, and the ground voltage VSS may be applied to the pull-down power line SB2. The ground voltage VSS may be applied to the pull-down power line SB3, and the bias voltage VBIAS2 may be applied to the pull-down power line SB4.

When the drive signals SAN1 and SAN2 are activated, the NMOS transistors N17, N18, N21, and N22 are turned on. Thus, the ground voltage VSS may be applied to the pull-down power line SB1, and the bias voltage VBIAS1 may be applied to the pull-down power line SB2. The bias voltage VBIAS2 may be applied to the pull-down power line SB3, and the ground voltage VSS may be applied to the pull-down power line SB4. Accordingly, the sensing signals CD3 and CD4 detected through the sensing nodes SA_F and SA_S of the first sense-amplifier 611 and the second sense-amplifier 612 may be output.

The data converter 700 may detect or sense multiple levels (multi-level) by discriminating the sensing signals CD3 and CD4 generated from the sensing circuit 610. For example, when each of two sensing signals CD3 and CD4 is detected as a logic level of data "1", the data converter 700 may discriminate data "1". When each of two sensing signals CD3 and CD4 are detected as a logic level of data "0", the data converter 700 may discriminate data "0". When the data converter 700 detects or senses the two sensing signals CD3 and CD4 having opposite logic levels, the data converter 700 may discriminate the (½×VCC) level.

As is apparent from the above description, the multi-level sensing circuit and the semiconductor device including the same according to the embodiments of the present disclosure can detect and store multi-level data in the same cell and thereby store more data per unit area of a silicon die than is possible with prior art binary-only memory devices.

Those skilled in the art will appreciate that the embodiments may be carried out in other specific ways than those set forth herein without departing from the spirit and essential characteristics of the disclosure. By way of example, those of ordinary skill will recognize that the capacitance C1 can be implemented using a single capacitor as well as two or more capacitors coupled in parallel or series. Similarly, a single transistor can be replaced by multiple transistors; PMOS transistor devices can be substitutes for NMOS transistor devices. The embodiments described above are therefore to be construed as illustrative and not restrictive. The scope of the disclosure should be determined by the appended claims and their legal equivalents, not by the above description. Further, all changes coming within the meaning and equivalency range of the appended claims are intended to be embraced therein. In addition, it is obvious to those skilled in the art that claims that are not explicitly cited in each other in the appended claims may be presented in combination as an embodiment or included as a new claim by a subsequent amendment after the application is filed.

Although a number of illustrative embodiments have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A semiconductor device comprising:
    a sense-amplifier configured to include a first pull-down power line and a second pull-down power line, and sense data of a pair of bit lines in response to drive voltages applied to first and second pull-down power lines during a sensing operation;
    a voltage controller configured to selectively supply bias voltages having different levels to the first and second pull-down power lines in response to drive signals activated at different times during the sensing operation; and
    a data converter configured to compare first sensed data and second sensed data received from the pair of bit lines with each other, and discriminate data in response to inversion or non-inversion of the compared data.

2. The semiconductor device according to claim 1, wherein the sense-amplifier includes:
    third and fourth transistors coupled to a pull-up power line through a common source terminal thereof, such that gate terminals thereof are cross-coupled to each other;
    a fifth transistor coupled between the third transistor and a first pull-down power line such that a gate terminal thereof is coupled to a bit line; and
    a sixth transistor coupled between the fourth transistor and a second pull-down power line such that a gate terminal thereof is coupled to a bit line bar.

3. The semiconductor device according to claim 1, wherein the pair of bit lines receives a bit-line precharge voltage level.

4. The semiconductor device according to claim 1, further comprising:
    a voltage generator configured to output a first bias voltage and a second bias voltage having different voltage levels to the voltage controller.

5. The semiconductor device according to claim 4, wherein:
    the first bias voltage is higher in level than the second bias voltage;
    the first bias voltage is lower in level than a bit-line precharge voltage; and
    the second bias voltage is set to a level that is equal to or higher than a ground voltage level.

6. The semiconductor device according to claim 1, further comprising:
   a drive signal generator configured to supply a first drive signal and a second drive signal activated at different times to the voltage controller.

7. The semiconductor device according to claim 1, wherein the voltage controller includes:
   a seventh transistor coupled between the first pull-down power line and a first bias voltage input terminal, and controlled by a first drive signal;
   an eighth transistor coupled between the second pull-down power line and a second bias voltage input terminal, and controlled by the first drive signal;
   a ninth transistor coupled between the first pull-down power line and the second bias voltage input terminal, and controlled by a second drive signal; and
   a tenth transistor coupled between the second pull-down power line and the first bias voltage input terminal, and controlled by the second drive signal.

8. The semiconductor device according to claim 1, wherein the voltage controller is included in a sub-hole region.

9. The semiconductor device according to claim 1, wherein the sense-amplifier shares the first and second pull-down power lines with another sense-amplifier formed in a contiguous region.

10. The semiconductor device according to claim 1, wherein:
   the data converter discriminates data "1" when each of a first sensing signal and a second sensing signal is output as data "1", and discriminates data "0" when each of the first sensing signal and the second sensing signal is output as data "0"; and
   the data converter discriminates a bit-line precharge voltage level when the first sensing signal and the second sensing signal are changed.

\* \* \* \* \*